United States Patent [19]
Kimura

[11] Patent Number: 5,883,418
[45] Date of Patent: Mar. 16, 1999

[54] SEMICONDUCTOR DEVICE WITH PARTICULAR SILICIDE STRUCTURE

[75] Inventor: Masatoshi Kimura, Hyogo, Japan

[73] Assignee: Mitsubishi Denki Kabushiki Kaisha, Tokyo, Japan

[21] Appl. No.: 873,026

[22] Filed: Jun. 11, 1997

Related U.S. Application Data

[63] Continuation of Ser. No. 544,218, Oct. 17, 1995, abandoned.

[30] Foreign Application Priority Data

Nov. 16, 1994 [JP] Japan ...................................... 6-282337

[51] Int. Cl.$^6$ ........................... H01L 29/76; H01L 29/94; H01L 31/062
[52] U.S. Cl. ........................... 257/412; 257/413; 257/384
[58] Field of Search ..................................... 257/412, 413, 257/768, 769, 770, 382, 383, 384

[56] References Cited

U.S. PATENT DOCUMENTS

| | | | |
|---|---|---|---|
| 4,886,764 | 12/1989 | Miller et al. ............................. | 379/355 |
| 4,914,500 | 4/1990 | Liu et al. ................................. | 257/384 |
| 5,027,185 | 6/1991 | Liauh ....................................... | 257/413 |
| 5,219,788 | 6/1993 | Abernathey et al. .................... | 438/636 |
| 5,221,853 | 6/1993 | Joshi et al. .............................. | 257/413 |

FOREIGN PATENT DOCUMENTS

| | | | |
|---|---|---|---|
| 63-284857 | 11/1988 | Japan ...................................... | 257/413 |
| 2-54536 | 2/1990 | Japan . | |

OTHER PUBLICATIONS

Chih–Shih Wei et al, Formation of Self–Aligned TiN/CoSi2 Bilayer from Co/Ti/Si and It's applications in Salicide, Diffusion Barrier and Contact Fill, Intel Corporation, VMIC Conference, IEEE, p. 232–239, Jun. 1990.

C.Y. Ting et al, The Use of $TISI_2$ for Self Aligned Silicide (Salicide) Technology, IBM Thomas J. Watson Research Center, V–MIC Conference, IEEE, pp. 307–318, Jun. 1985.

M. Lawrence et al, Growth of Epitaxial $CoSi_2$ on (100) Si, Intel Corporation, American Institute of Physics, Appl. Phys. Lett. vol. 58, No. 12, pp. 1308–1311, Mar. 1991.

*Primary Examiner*—Wael Fahmy
*Attorney, Agent, or Firm*—McDermott, Will & Emery

[57] ABSTRACT

A silicide layer having a two-layer structure or a silicide layer made of material having high etching selectivity is formed on a silicon layer constituting a gate electrode, causing the silicide layer to serve as an etching stopper at the time of forming a contact hole. Furthermore, a top surface of an insulating layer in which a contact hole is formed is planarized by a CMP method, facilitating subsequent formation of an interconnection or the like. In addition, when a silicide layer consisting of two layers is formed on the gate electrode, each of those two layers can be made of either the same material or materials different from each other. Thus, even if contact holes extending to the gate electrode and source/drain regions are simultaneously formed in the planarized insulating layer, lower layers of the gate electrode and the source/drain regions will not be etched, resulting in a semiconductor device in which an interconnection on the insulating layer can be formed easily.

16 Claims, 15 Drawing Sheets

SEMICONDUCTOR DEVICE WITH PARTICULAR SILICIDE STRUCTURE

This application is a continuation of application Ser. No. 08/544,218 filed Oct. 17, 1995 now abandoned.

BACKGROUND OF THE INVENTION

1. Field of the Invention

The present invention relates to a semiconductor device such as a semiconductor memory device or the like and a manufacturing method thereof, and more particularly, to an MIS (Metal Insulator Semiconductor) type semiconductor device in which a silicide layer is formed on a gate electrode and source/drain regions, and a manufacturing method thereof.

2. Description of the Background Art

FIG. 35 is a cross section showing a conventional semiconductor device disclosed, for example, in Japanese Patent Laying-Open No. 2-54536. As shown in FIG. 35, a number of active regions are separated from each other by an element isolation region 2 formed of a field insulating film at a surface of a semiconductor substrate 1 made of p-type monocrystalline silicon, and an MOSFET (Metal Oxide Semiconductor Field Effect Transistor) is formed therein.

The MOSFET has a gate electrode 5 located on a thin gate insulating layer 3 formed of silicon dioxide, and source/drain regions 6 formed at the surface of semiconductor substrate 1.

Gate electrode 5 is constituted by a silicon layer 4 on which low-resistance silicide layers 8a and 8b are formed, and a low-resistance silicide layer 8c is formed on each of source/drain regions 6. The total thickness of silicide layers 8a and 8b on silicon layer 4 is larger than a thickness of silicide layer 8c formed on each of source/drain regions 6.

Sidewalls 9 made of insulating material such as silicon oxide film or the like are formed on side portions of gate insulating layer 3, silicon layer 4, and silicide layers 8a and 8b by CVD (Chemical Vapor Deposition) technique and reactive etching.

In addition, an insulating film 10 and an interconnection layer 11 are formed on the elements formed as described above. A top surface of insulating film 10 has a difference in level corresponding to that of a lower layer. A portion of interconnection layer 11 is in contact with silicide layer 8c on source/drain region 6 through a contact 12. Furthermore, an n+diffusion region 7a having high impurity concentration is formed under source/drain regions 6, and an n−diffusion region 7b having low impurity concentration is formed under sidewall 9.

The reason why the total thickness of silicide layers 8a and 8b on gate electrode 5 is made larger than a thickness of silicide layer 8c on source/drain region 6 in the conventional semiconductor device is that formation of a thicker silicide layer enables reduction in sheet resistance.

Since the conventional semiconductor device is constituted in such a manner as described above, sheet resistance of gate electrode 5 has been reduced, and source/drain regions 6 have been prevented from being etched through at the time of forming a contact hole. Recently, however, we found that technique of planarizing a formed layer in formation of a semiconductor device, that is, a CMP (Chemical Mechanical Polishing) method which was hardly used at home as of August, 1988 when patent application on this conventional semiconductor device was filed, has been used, causing the following problems.

FIG. 36 is a cross section showing a semiconductor device formed by means of a conventional technique, in which an insulating layer 10 is formed at least on a silicon layer 4 and source/drain regions 6 by a technique such as CVD to have a uniform thickness. A contact hole 12a is formed to be in contact with a silicide layer 8 on a gate electrode 5. A contact hole 12b is formed to be in contact with a silicide layer 8 on source/drain region 6. Silicide layer 8 on gate electrode 5 and silicide layer 8 on each source/drain region 6 have the same thickness. The same reference as that shown in FIG. 35 indicates the same or a corresponding portion.

As shown in FIG. 36, a thickness A of insulating layer 10 on silicide layer 8 formed on an element isolation region 2 and a thickness B of insulating layer 10 on source/drain region 6 formed at a main surface of a semiconductor substrate 1 are approximately the same. In addition, a surface 10a of insulating layer 10 has a difference in level C as shown in the figure. If surface 10a of insulating layer 10 is uneven as described above, problems such as degradation in accuracy of the dimension in forming an interconnection and an element, disconnection of the interconnection or the like occur.

Top surface 10a of insulating layer 10 is planarized as shown in FIG. 37 when processed by means of the above described CMP method, the difference in level C of top surface 10a of insulating layer 10 shown in FIG. 36 is eliminated, and a thickness D of insulating layer 10 on silicide layer 8 formed on element isolation region 2, that is, a depth D of contact hole 12a to be formed is significantly reduced compared to that of insulating layer 10 which has not been planarized.

On the other hand, a thickness E of insulating layer 10 on source/drain region 6, that is, a depth E of contact hole 12b to be formed can be made approximately the same as that of insulating layer 10 which has not been planarized.

It is noted that silicide layer 8 on gate electrode 5 and silicide layer 8 on each source/drain region 6 has the same thickness.

We found that, in the case of forming planarized insulating layer 10 and forming a contact simultaneously on both source/drain region 6 and gate electrode 5, if insulating layer 10 is etched to form complete contact hole 12b which is in contact with source/drain region 6, gate electrode 5 is etched through because insulating layer 10 on gate electrode 5 is thinner than that on source/drain region 6, causing malfunction of a semiconductor device.

We also found that, in the conventional example shown in FIG. 37, although silicide layer 8 is formed on gate electrode 5 and the like, use of insulating layer 10 planarized by the CMP method makes it more difficult to prevent an electrode from being etched through in formation of a contact hole than in the conventional example.

SUMMARY OF THE INVENTION

It is an object of the present invention to provide a semiconductor device in which a gate electrode layer is not damaged even if a contact hole is formed in a planarized insulating layer, and a manufacturing method of the same.

A semiconductor device in accordance with one aspect of the present invention includes a semiconductor substrate, a pair of source/drain regions, a gate electrode layer, a first silicide layer, a second silicide layer, and an insulating layer. The semiconductor substrate has a main surface. The pair of source/drain regions are formed with a prescribed space therebetween at the main surface of the semiconductor substrate. The gate electrode layer is formed on a region sandwiched between the pair of source/drain regions with a gate insulating layer interposed. The first silicide layer is formed to be in contact with a surface of each source/drain region, and has a first thickness. The second silicide layer is formed to be in contact with a surface of the gate electrode layer, and has a second thickness larger than the first thickness. The insulating layer is formed on the gate electrode layer and the source/drain regions, has contact holes respectively reaching to the surfaces of the first and the second silicide layers, and has a substantially flat top surface.

In the semiconductor device according to the above mentioned one aspect of the present invention, the silicide layer formed on the gate electrode layer is thicker than that formed on each source/drain region. Thus, even if a planarized insulating layer is etched to form a contact hole, the gate electrode layer can be prevented by the relatively thick silicide layer formed thereon from being damaged.

In a semiconductor device in accordance with one preferred aspect of the present invention, a second silicide layer has a first layer and a second layer. The first layer is formed on a gate electrode layer. The second layer is formed on the first layer, and is made of material different from that of the first layer.

In the semiconductor device in accordance with the above mentioned one preferred aspect of the present invention, a silicide layer formed on the gate electrode layer has a structure in which a plurality of layers of which etching characteristics are different from each other are stacked. Thus, the gate electrode layer can be restrained more effectively from being etched through at the time of forming a contact hole.

A semiconductor device in accordance with another aspect of the present invention includes a semiconductor substrate, a pair of source/drain regions, a gate electrode layer, a first silicide layer, a second silicide layer, a titanium nitride layer, and a sidewall insulating layer. The semiconductor substrate has a main surface. The pair of source/drain regions are formed with a prescribed space therebetween at the main surface of semiconductor substrate. The gate electrode layer is formed on a region sandwiched between the pair of source/drain regions with a gate insulating layer interposed. The first silicide layer is formed to be in contact with a surface of each source/drain region. The second silicide layer is formed to be in contact with a surface of the gate electrode layer and is made of material different from that of the first silicide layer. The titanium nitride layer is formed on the second silicide layer. The sidewall insulating layer is formed to be in contact with sidewalls of the gate electrode layer, the second silicide layer, and the titanium nitride layer.

In the semiconductor device in accordance with the above mentioned another aspect of the present invention, a titanium nitride layer is further formed on the first silicide layer. Thus, in patterning the gate electrode layer, reflection of energy lines and the like at a bottom surface of a resist film, which occurs at the time of exposing a resist pattern formed on this titanium nitride layer, can be restrained.

In a semiconductor device in accordance with another preferred aspect of the present invention, a second silicide layer is made of material having lower etching rate than a first silicide layer.

In the semiconductor device in accordance with the above mentioned another preferred aspect of the present invention, a silicide layer having low etching rate is formed on the gate electrode layer. Thus, the gate electrode layer is less susceptible to etching than a silicide layer formed on each of a pair of source/drain regions. Therefore, when a contact hole reaching to a surface of each source/drain region and a contact hole reaching to a surface of the gate electrode layer are formed simultaneously, the gate electrode layer can be prevented from being damaged by etching.

A semiconductor device in accordance with a further aspect of the present invention includes a semiconductor substrate, a pair of source/drain regions, a gate electrode layer, a first silicide layer, and a second silicide layer. The semiconductor substrate has a main surface. The pair of source/drain regions are formed with a prescribed space therebetween at the main surface of the semiconductor substrate. The gate electrode layer is formed on a region sandwiched between the pair of source/drain regions with a gate insulating layer interposed. The first silicide layer is formed to be in contact with a surface of the source/drain region. The second silicide layer is formed to be in contact with a surface of the gate electrode layer. The second silicide layer has a first layer and a second layer. The first layer is formed on the gate electrode layer. The second layer is formed on the first layer, and is made of material different from that of the first layer.

In the semiconductor device in accordance with the above mentioned further aspect of the present invention, the silicide layer on the gate electrode layer has a structure in which a plurality of layers of which etching characteristics are different from each other are stacked. Thus, the gate electrode layer can be restrained more effectively from being etched through at the time of etching to form a contact hole.

A semiconductor in accordance with a further preferred aspect of the present invention further includes an element isolation insulating layer and a second gate electrode layer. The element isolation insulating layer is formed at the main surface of the semiconductor substrate so that a top surface thereof is substantially flush with the main surface of the semiconductor substrate. The second gate electrode layer is formed on the element isolation insulating layer. A top surface of the gate electrode layer is located at substantially the same height from the main surface of semiconductor substrate 1 as a top surface of the second gate electrode layer.

In the semiconductor device in accordance with the above mentioned further preferred aspect of the present invention, the top surface of the element isolation insulating layer is substantially flush with the main surface of the semiconductor substrate. Thus, difference in height between the gate electrode layer formed on the element isolation insulating layer and the silicide layer on each source/drain region formed at the main surface of a semiconductor substrate can be reduced.

A method of manufacturing a semiconductor device in accordance with one aspect of the present invention includes the following steps.

First, a gate electrode layer is formed on a main surface of a semiconductor substrate with a gate insulating layer therebetween. Then, a pair of source/drain regions are formed with a prescribed space therebetween at the main surface of the semiconductor substrate so as to sandwich a region under the gate electrode layer. A first silicide layer having a first thickness is then formed to be in contact with a surface of each source/drain region. A second silicide layer having a second thickness larger than the first thickness is formed to be in contact with a surface of the gate electrode layer. Then, an insulating layer having a substantially flat top surface and having contact holes extending from the top surface to the surfaces of the first and the second silicide layers, respectively, is formed on the main surface of the semiconductor substrate.

In the method of manufacturing a semiconductor device in accordance with the above mentioned one aspect of the present invention, the silicide layer on the gate electrode layer is formed thicker than the silicide layer on each source/drain region. Thus, the gate electrode layer can be prevented by the silicide layer thereon from being damaged even when a planarized insulating layer is etched to form a contact hole therein.

A method of manufacturing a semiconductor device in accordance with another aspect of the present invention includes the following steps.

First, a gate electrode layer is formed on a main surface of a semiconductor substrate with a gate insulating layer interposed. Then, a pair of source/drain regions are formed with a prescribed space therebetween at the main surface of the semiconductor substrate so as to sandwich a region under the gate electrode layer. A second silicide layer is then formed to be in contact with a surface of the gate electrode silicide layer. A titanium nitride layer is formed on the second silicide layer. Then, a first silicide layer made of material different from that of the second silicide layer is formed to be in contact with a surface of each source/drain region. A sidewall insulating layer is formed to be in contact with sidewalls of the gate electrode layer, the second silicide layer and the titanium nitride layer.

In the method of manufacturing a semiconductor device in accordance with the above mentioned another aspect of the present invention, a titanium nitride layer is further formed on the first silicide layer. Thus, in patterning the gate electrode layer, reflection of energy lines and the like at a bottom surface of a resist film, which occurs at the time of exposing a resist pattern formed in this titanium nitride layer, can be restrained.

A method of manufacturing a semiconductor device in accordance with a further aspect of the present invention includes the following steps.

First, a gate electrode layer is formed on a main surface of a semiconductor substrate with a gate insulating layer interposed. Then, a pair of source/drain regions are formed with a prescribed spaced therebetween at the main surface of the semiconductor substrate so as to sandwich a region under the gate electrode layer. A first silicide layer is then formed to be in contact with a surface of each source/drain region. A second silicide layer is formed to be in contact with a surface of the gate electrode layer. The step of forming the second silicide layer includes the steps of forming a first layer made of silicide on the gate electrode layer, and forming a second layer made of silicide different from that of the first layer on the first layer.

In the method of manufacturing a semiconductor device in accordance with the above mentioned further aspect of the present invention, the silicide layer on the gate electrode layer is formed to have a structure in which a plurality of layers which are different in etching characteristics from each other are stacked. Thus, the gate electrode layer can be restrained from being etched through at the time of etching to form a contact hole.

A method of manufacturing a semiconductor in accordance with a preferred aspect of the present invention further includes the following steps.

First, an element isolation insulating layer is formed at a main surface of a semiconductor substrate by an LOCOS (LOCal Oxidation of Silicon) method. Then, the element isolation insulating layer is etched so that a top surface thereof is substantially flush with the main surface of the semiconductor substrate. A second gate electrode layer is formed on the top surface of the element isolation insulating layer. A top surface of the second gate electrode layer is located at substantially the same height with respect to the main surface of semiconductor substrate I as the top surface of the gate electrode layer.

In the method of manufacturing a semiconductor device in accordance with the above mentioned preferred aspect of the present invention, the element isolation insulating layer is etched so that the top surface thereof is substantially flush with the main surface of the semiconductor substrate. Thus, difference in height between a silicide layer on the gate electrode layer formed on the element isolation insulating layer and a silicide layer on each source/drain region formed at the main surface of the semiconductor substrate can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
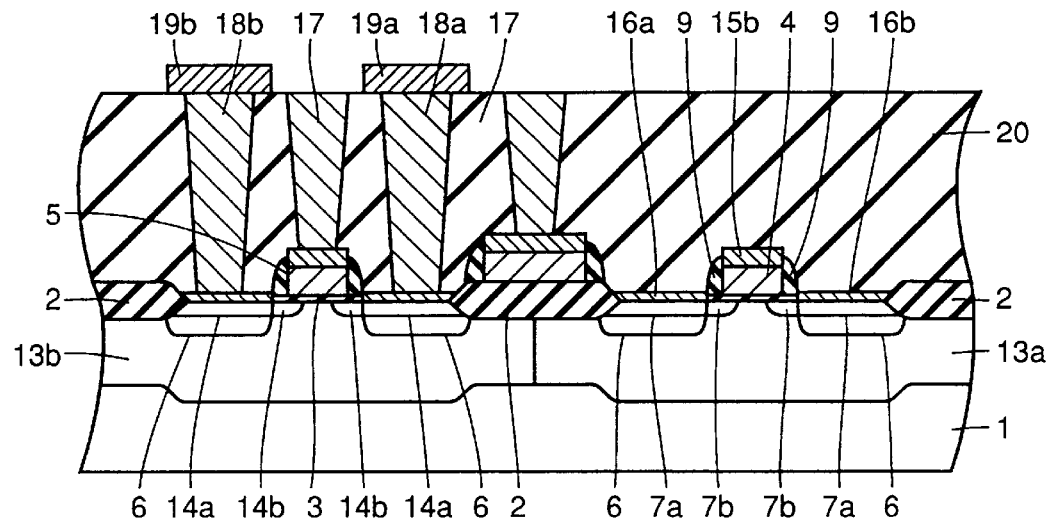
FIG. 1 is a cross section showing a semiconductor device if accordance with a first embodiment of the present invention.
Figure 35:
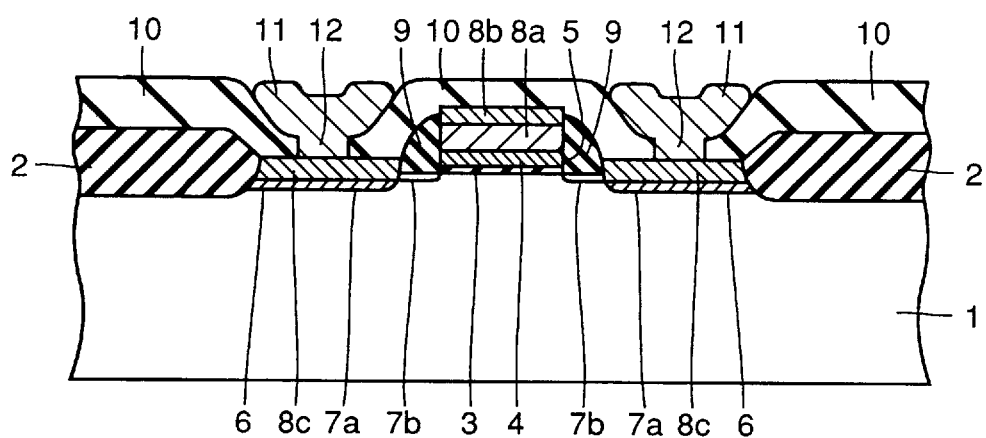
FIG. 35 is a cross section showing a conventional example of a semiconductor device.
Figure 36:
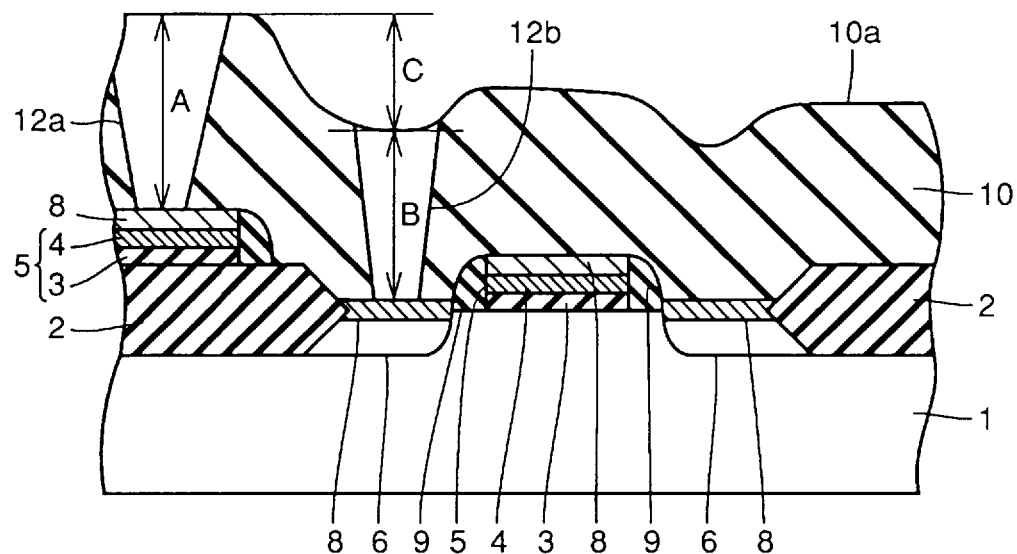
FIG. 36 is a cross section showing a conventional example of a semiconductor device.
Figure 37:
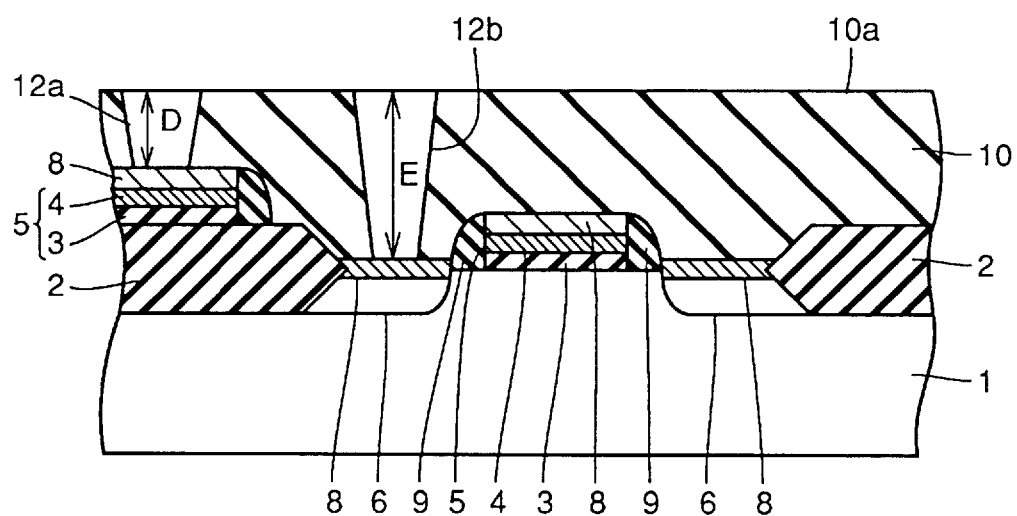
FIG. 37 is a cross section showing a conventional example of a semiconductor device.

The following is description of a first embodiment of the present invention in conjunction with the accompanying drawings. In FIG. 1, a gate electrode 5 is formed on a gate insulating layer 3, and consists of a silicon layer 4. A p-type impurity diffusion region 13a is formed at a main surface of a semiconductor substrate. An n-type impurity diffusion region 13b is formed at the main surface of the semiconductor substrate. A p$^+$diffusion region 14a and a p$^-$diffusion region 14b are formed at a surface of the n-type impurity diffusion region. A silicide layer 15b is formed on gate electrode 5. Silicide layers 16a and 16b are respectively formed on source/drain regions 6. A word line contact 17 is formed to be in contact with silicide layer 15b on gate electrode 5. Contacts 18a and 18b are formed to be in contact with silicide layers 16a and 16b formed on source/drain regions 6, respectively. Interconnections 19a and 19b are formed of metal and the like on an insulating layer 20 planarized by the CMP method. The same reference as that of the conventional example shown in FIGS. 35 to 37 indicates the same or a corresponding portion.

A method of manufacturing the semiconductor device shown in FIG. 1 will now be described with reference to FIGS. 2 to 11.

Figure 2:
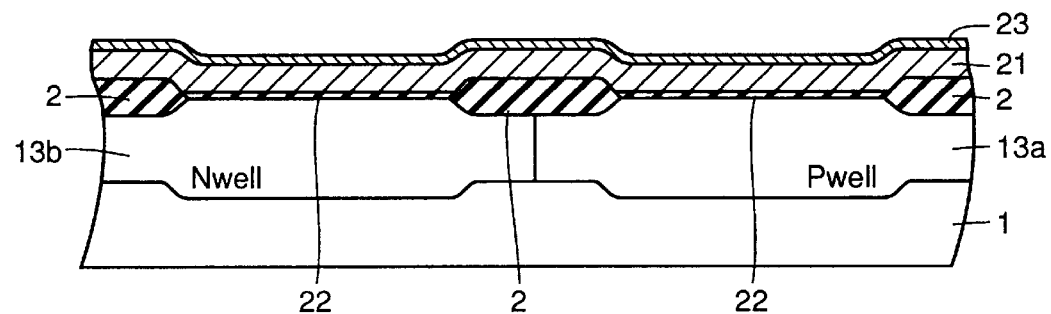
FIGS. 2 to 11 are cross sections respectively showing, in order, the steps of a method of manufacturing a semiconductor device in accordance with the first embodiment of the present invention.

First, as shown in FIG. 2, an element isolation region 2 is formed at the main surface of semiconductor substrate 1. The p-type impurity diffusion region 13a is formed in a region in which an n-channel transistor is to be formed, and the n-type impurity diffusion region 13b is formed in a region in which a p-channel transistor is to be formed. Then, an insulating layer 22 which will be a gate insulating layer is formed in a region other than element isolation region 2 at the main surface of semiconductor substrate 1. A polycrystalline silicon layer 21 is formed by sputtering or the CVD method on semiconductor substrate 1 in which element isolation region 2 and insulating layer 22 have been formed. In addition, a titanium layer is deposited on polycrystalline silicon layer 21 by sputtering or the like, and is silicified, thereby forming a titanium silicide layer 23 (FIG. 2).

Figure 3:
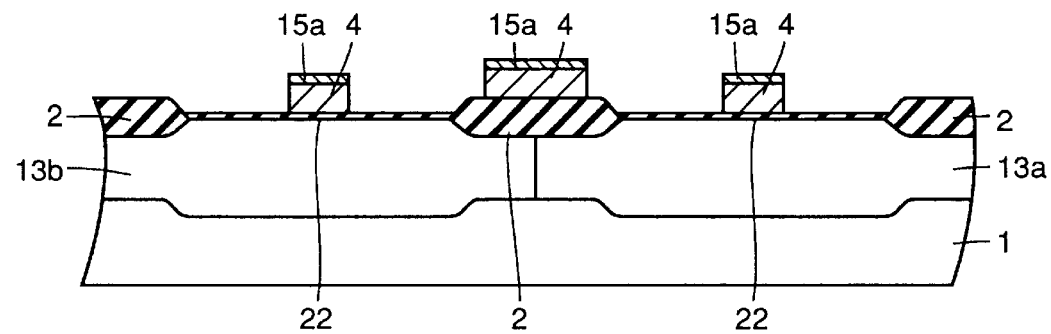

Then, in order to form a gate electrode, a resist pattern is formed on a region of titanium silicide layer 23 which will be a gate electrode. Etching is performed using this resist pattern as a mask, and the resist pattern is then removed. Thus, as shown in FIG. 3, silicon layer 4 constituting gate electrode 5 is formed, and a silicide layer 15a is formed thereon.

Figure 4:
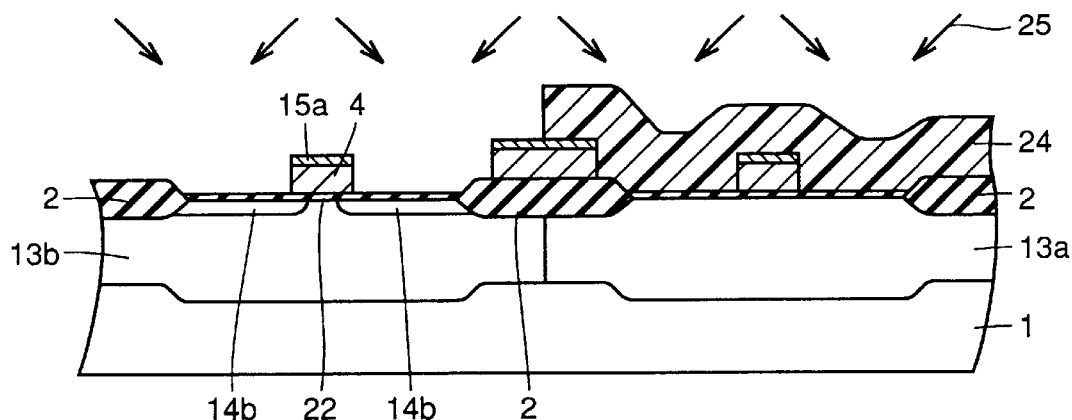

Then, a resist film 24 is formed as shown in FIG. 4, and p-type impurities are implanted into n-type diffusion region 13b in a direction 25 in which ions are implanted, that is, an oblique a direction with respect to semiconductor substrate 1, forming a p⁻diffusion region 14b. After that, resist film 24 is removed, p-type diffusion region 13a is processed similarly to the case of n-type diffusion region 13b, and n-type impurities are implanted into an upper portion of p-type diffusion region 13a, forming an n⁻diffusion region 7b for forming an LDD (Lightly Doped Drain) structure.

Figure 5:
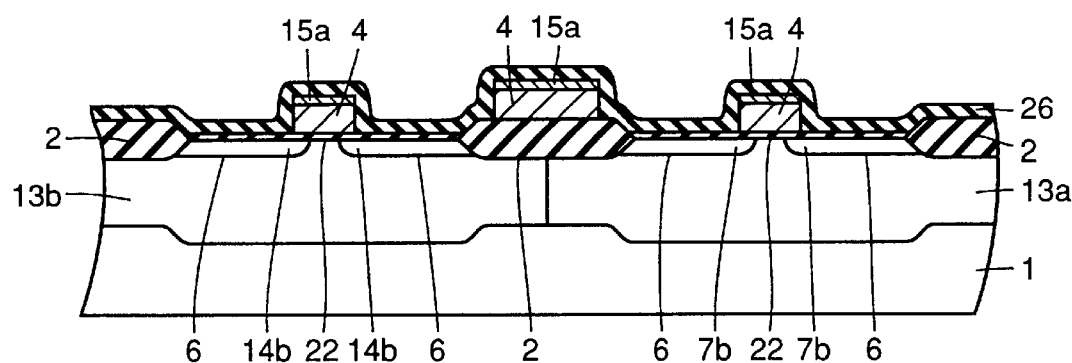
Figure 6:
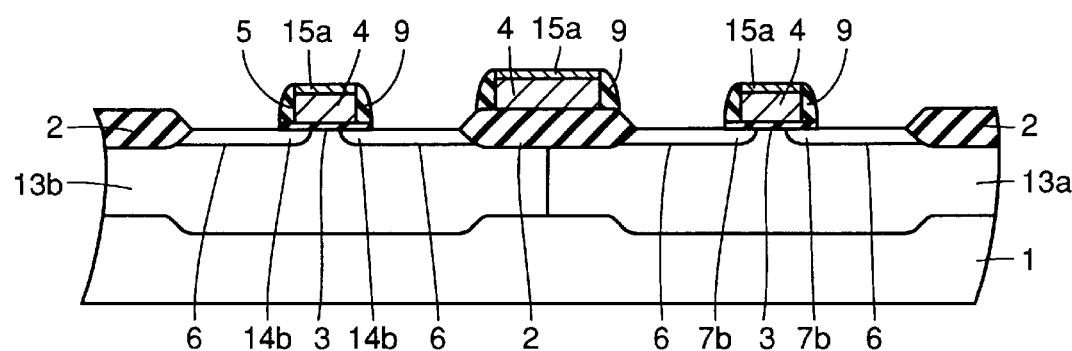

Then, an insulating layer 26 is formed on a whole surface of semiconductor substrate 1 as shown in FIG. 5. Insulating layer 26 is left on side portions of gate electrode 5 by anisotropically etching insulating layer 26, thereby forming sidewalls 9 as shown in FIG. 6.

At this time, gate insulating layer 22 on source/drain regions 6 is simultaneously removed by anisotropic etching, whereby semiconductor substrate 1 on source/drain regions 6 is exposed.

Figure 7:
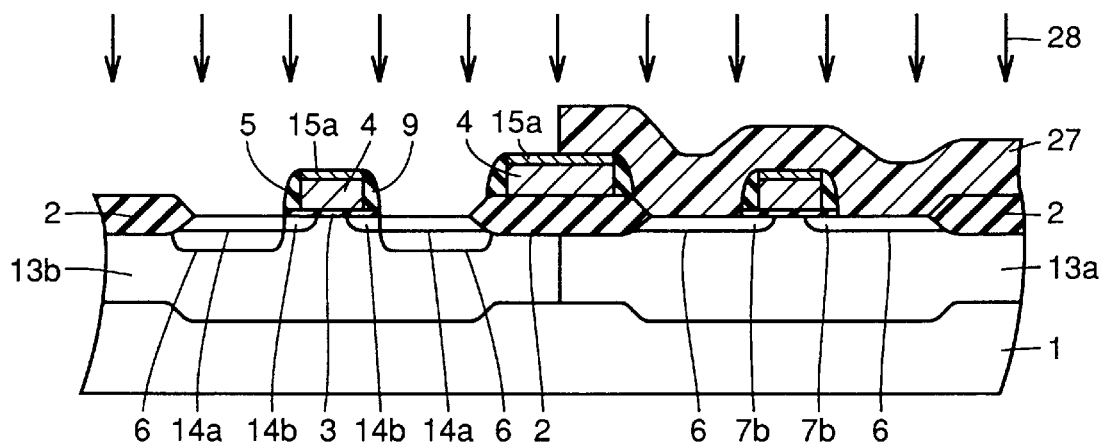

Then, a resist film 27 is formed as shown in FIG. 7, and p-type impurity ions are implanted into an upper portion of n-type diffusion region 13b in a direction 28 in which ions are implanted, that is, a direction perpendicular to the main surface of semiconductor substrate 1. Thus, a p⁺diffusion region 14a is formed. Then, resist film 27 is removed, and n-type impurities are implanted into p-type diffusion region 13a as in the case of n-type diffusion region 13b, thereby forming an n⁺ diffusion region 7a. Thus, the LDD structure is formed.

Figure 8:
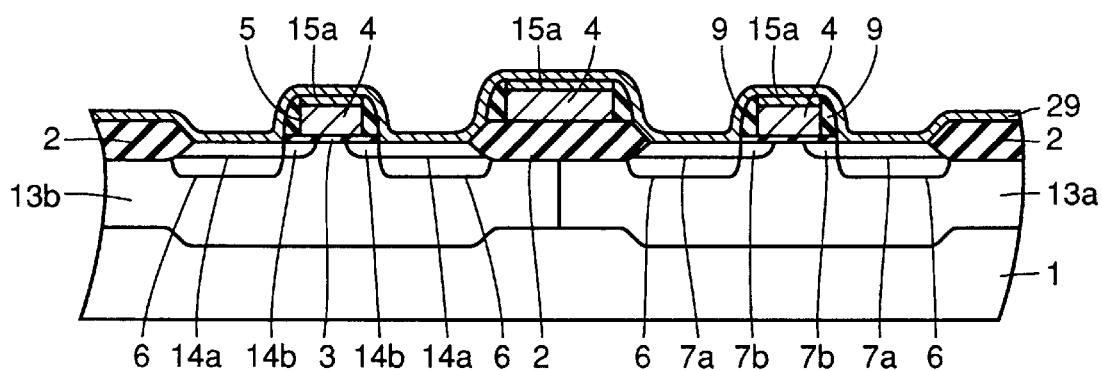
Figure 9:
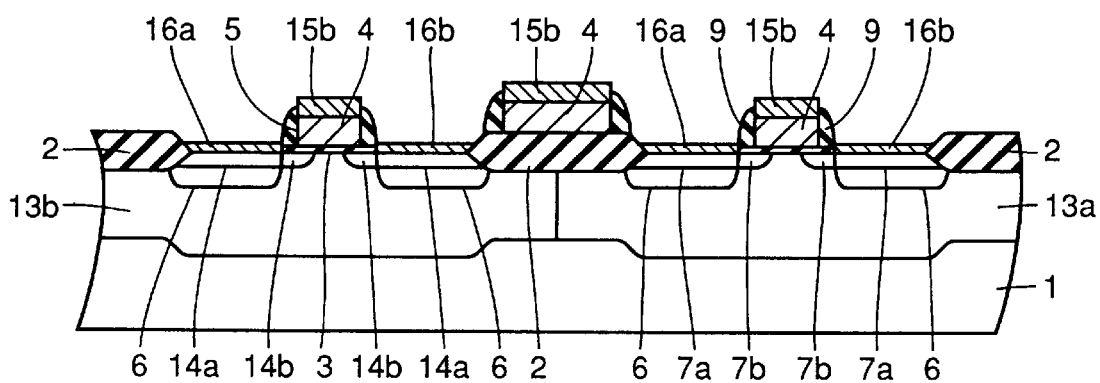
Figure 10:
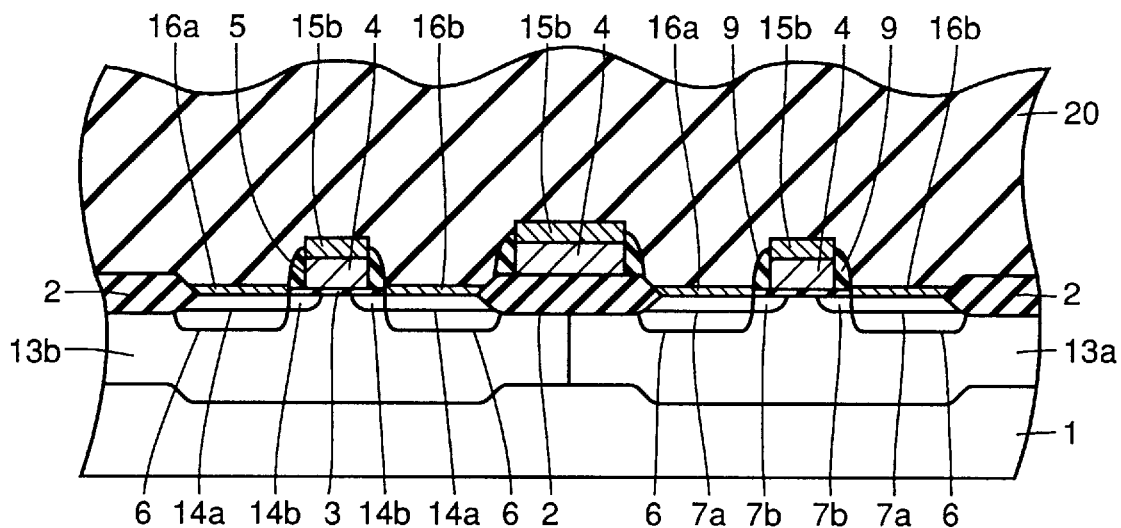

A natural oxide film formed on each source/drain region 6 at the time of forming a diffusion layer is removed by light etching to expose semiconductor substrate 1. Then, a titanium layer 29 is formed on the whole surface of semiconductor substrate 1 by sputtering or the like as shown in FIG. 8. After that, the substrate is heated for several tens of seconds at a temperature in the range from about 600° to about 900° C. by an RTA (Rapid Thermal Annealing) method. Thus, silicide layers 16a and 16b are formed on source/drain regions 6 as shown in FIG. 9. Furthermore, a silicide layer having the same thickness as that of silicide layers 16a and 16b is formed on silicide layer 15a which has been formed on silicon layer 4 in the previous step. As a result, a silicide layer 15b (including silicide layer 15a) which is thicker than each of silicide layers 16a and 16 on source/drain regions 6 is formed.

Figure 11:
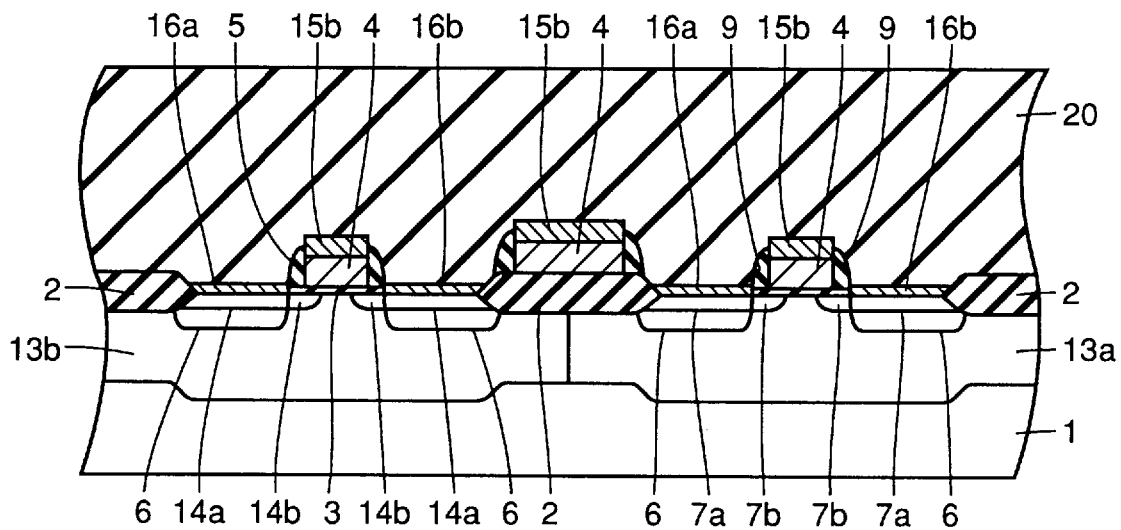

Then, an insulating layer 20 is formed on the whole surface of semiconductor substrate 1 in which such elements as described above have been formed, as shown in FIG. 10. At this time, since gate electrode 5 and element isolation region 2 have been formed on semiconductor substrate 1, a surface of insulating layer 20 formed is not flat and has concaves and convexes. Formation of an interconnection or the like on this insulating layer 20 having concaves and convexes may cause degradation in accuracy of the dimensions, disconnection of the interconnection and the like. Thus, planarization is carried out by CMP technique which has been used recently. Accordingly, since a top surface of insulating layer 20 becomes flat without concaves and convexes as shown in FIG. 11, formation of an interconnection on this insulating layer becomes significantly easy, achieving highly accurate dimensions of the interconnection.

In addition, even when contacts 17, 18a and 18b are simultaneously formed by etching to be in contact with silicide layers 15b, 16a and 16b on gate electrode 5 and source/drain regions 6, respectively, in forming contact holes, silicide layer 15b formed on gate electrode 5 is thick and etching selectivity thereof is large. In other words, when etching is performed at the time of forming a contact hole, etching rate of silicide layer 15b is smaller than that of insulating layer 20. Thus, silicide layer 15b will not be etched through, and therefore, gate electrode 5 will not be damaged.

Thus, a semiconductor device, in particular, a field effect transistor including planarized insulating layer 20 shown in FIG. 1 is formed.

The following is description of other methods by which a structure similar to that of FIG. 1 can be obtained.

In one method, silicide layer 15b formed on silicon layer 4 which will be gate electrode 5 is made to have a two-layer structure. In other words, two layers of high refractory metal such as titanium are stacked by sputtering, and then simultaneously silicified by the RTA method, thereby forming a two-layer silicide layer.

Furthermore, if a lower layer of these stacked high refractory metal layers is made of material having higher etching selectivity than that of an upper layer thereof, the silicide layer on gate electrode 5 has much higher selectivity than each of silicide layers 16a and 16b on source/drain regions 6, whereby a contact hole can be formed easily.

In another method, silicide layer 15b formed on gate electrode 5 is made to have a two-layer structure in which silicide layer 15a of a lower layer is obtained by implanting high refractory metal ions into an upper portion of silicon layer 4 and then silicifying it by the RTA method.

These methods can produce the same structure as that shown in FIG. 1, causing effects similar to those of FIG. 1.

[Embodiment 2]

A second embodiment of the present invention will now be described.

Figure 12:
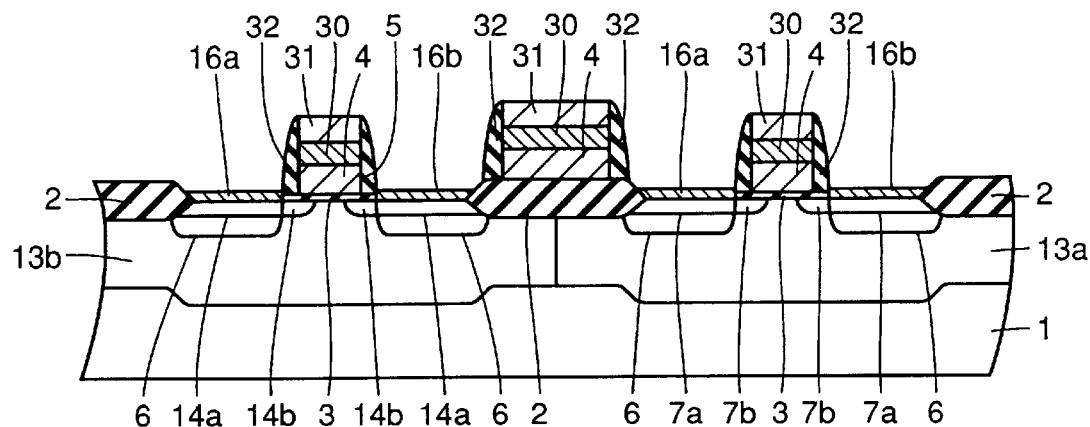
FIG. 12 is a cross section showing a semiconductor device in accordance with a second embodiment of the present invention.

In FIG. 12, a cobalt silicide layer 30 having etching selectivity twice to three times that of titanium silicide is formed on a silicon layer 4 constituting a gate electrode 5. A titanium nitride layer 31 is formed on cobalt silicide layer 30. A sidewall 32 is formed of an insulating layer on side surfaces of silicon layer 4 constituting the gate electrode 5, cobalt silicide layer 30, and titanium nitride layer 31. It is noted that the same reference as that shown in the conventional example and in the first embodiment indicates the same or a corresponding portion.

The manufacturing process of the semiconductor device shown in FIG. 12 will now be described with reference to FIGS. 13 to 21.

Figure 13:
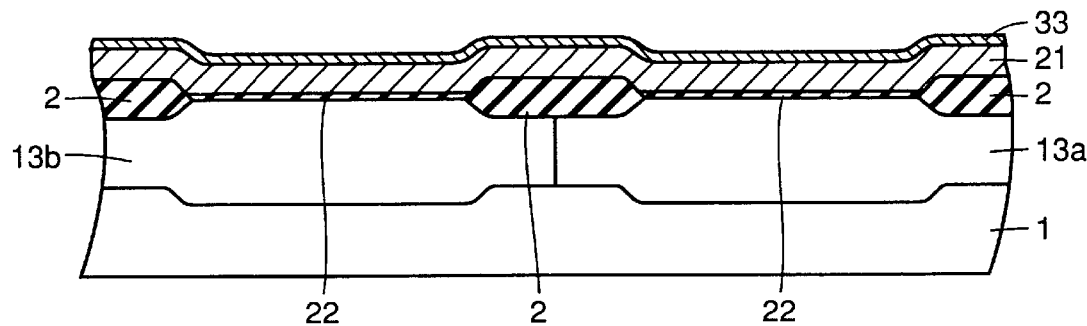
FIGS. 13 to 21 are cross sections respectively showing, in order, the steps of a method of manufacturing a semiconductor device in accordance with the second embodiment of the present invention.

First, as shown in FIG. 13, an element isolation region 2 is formed at a main surface of a semiconductor substrate 1. A p-type impurity diffusion region 13a is formed in a region in which an n-channel transistor is formed, and an n-type impurity diffusion region 13b is formed in a region in which a p-channel transistor is formed. Then, an insulating layer 22 which will be a gate insulating layer 3 is formed in a region other than element isolation region 2 at the main surface of the semiconductor substrate 1. A polycrystalline silicon layer 21 is formed by sputtering or a CVD technique on semiconductor substrate 1 in which element isolation region 2 and insulating layer 22 have been formed. Then, a cobalt layer 33 is deposited on polycrystalline silicon layer 21, for example, by sputtering.

Figure 14:
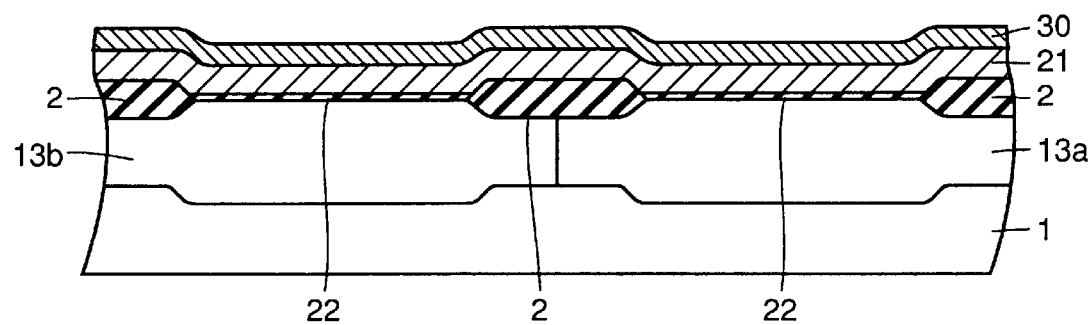
Figure 15:
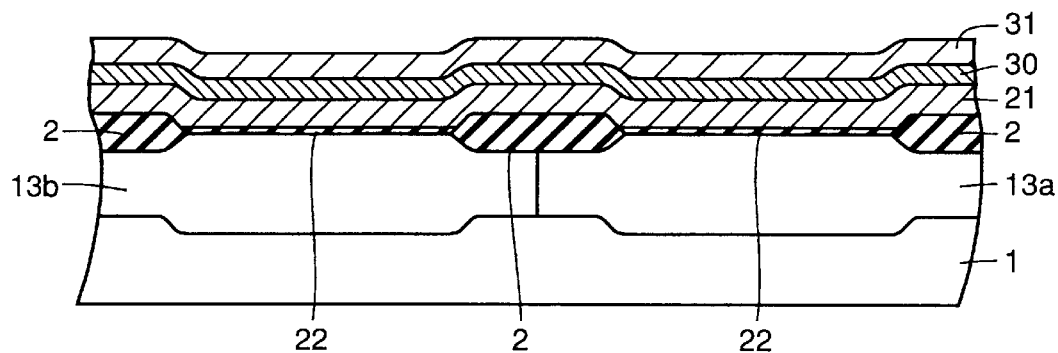

Then, a cobalt silicide layer 30 shown in FIG. 14 is formed by silicifying cobalt layer 33 by an RTA method or the like.

A titanium nitride layer 31 is formed on the whole surface of semiconductor substrate 1.

Figure 16:
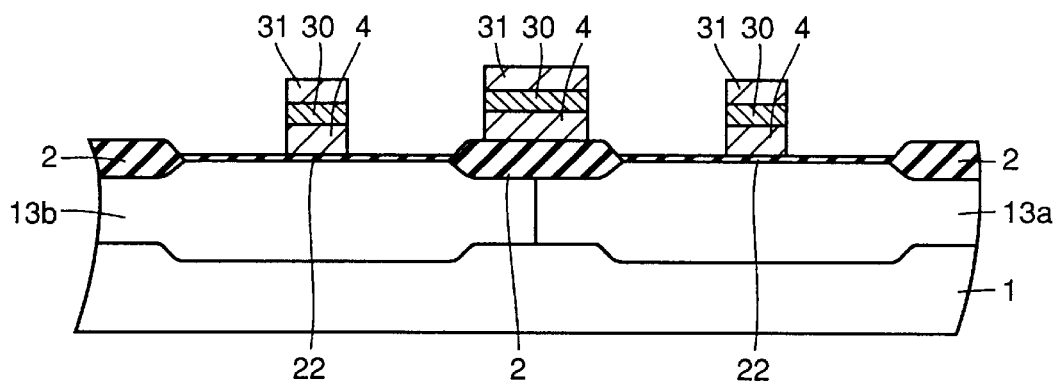

Then, in order to form gate electrode 5, a resist pattern with a prescribed shape is formed for etching, and titanium nitride layer 31, cobalt silicide layer 30 and polycrystalline silicon layer 21 are formed to have the same size as that of gate electrode 5. Thus, silicon layer 4 constituting gate electrode 5 is formed, and cobalt silicide layer 30 and titanium nitride layer 31 are formed thereon in this order, as shown in FIG. 16.

Figure 17:
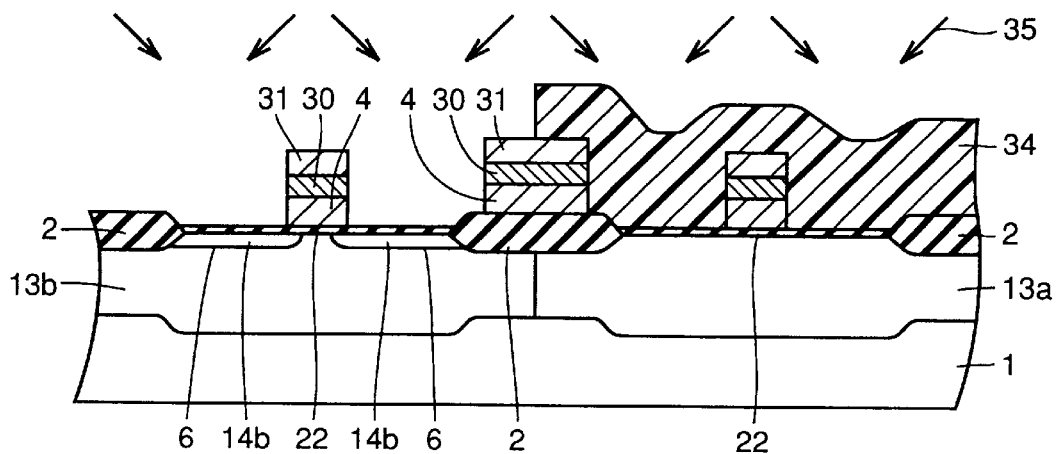

Then, a resist film 34 is formed as shown in FIG. 17, and p-type impurities are implanted into n-type diffusion region 13b in a direction 35 of ion implantation, that is, in an oblique direction with respect to semiconductor substrate 1 to form a p$^-$diffusion region 14b. Furthermore, resist film 34 is then removed, process similar to the case of n-type diffusion region 13b is carried out for p-type diffusion region 13a, and n-type impurities are implanted into an upper portion of p-type diffusion region 13a, thereby forming an n$^-$diffusion region 7b for forming an LDD structure.

Figure 18:
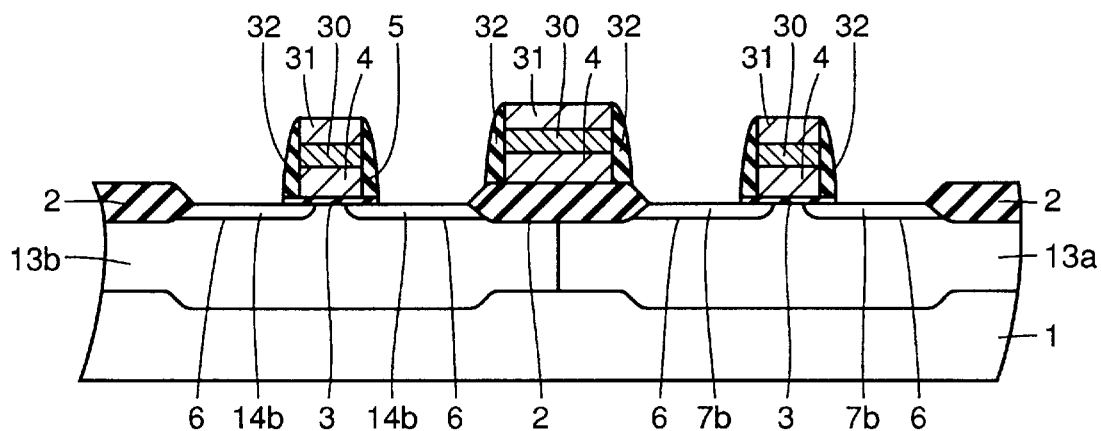

In addition, sidewalls 32 are formed of insulating material on sidewalls of silicon layer 4 constituting gate electrode 5, cobalt silicide layer 30, and titanium nitride layer 31 (FIG. 18). Since the step of forming the sidewalls is similar to that described in the first embodiment, description thereof will not be repeated.

At this time, insulating layer 22 on each source/drain region 6 is removed simultaneously, whereby semiconductor substrate 1 on each source/drain region 6 is exposed.

Figure 19:
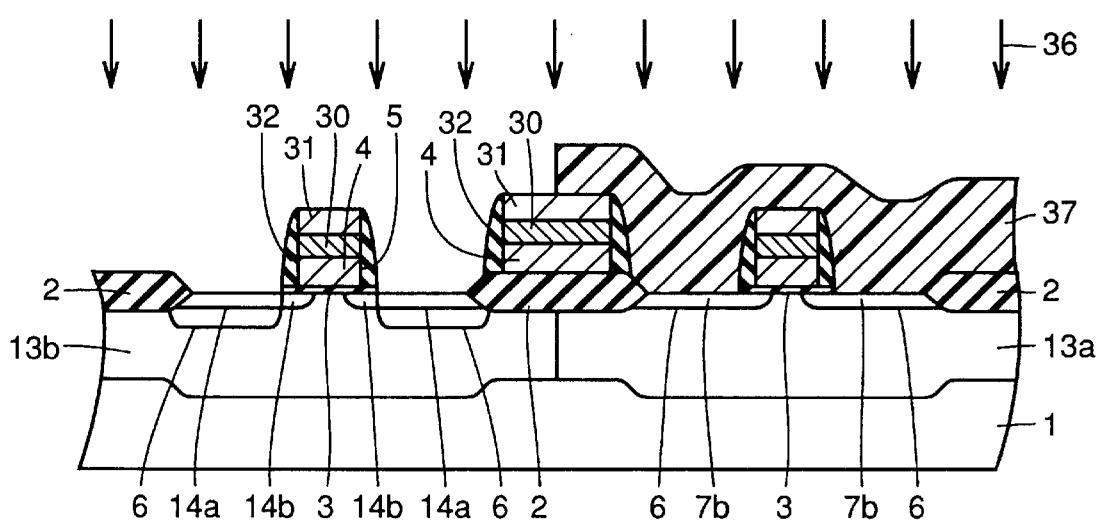
Figure 20:
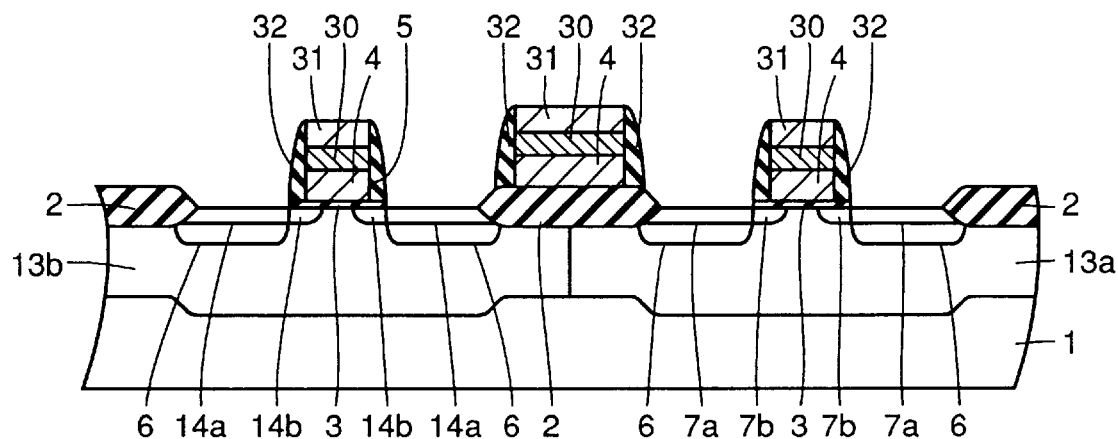
Figure 21:
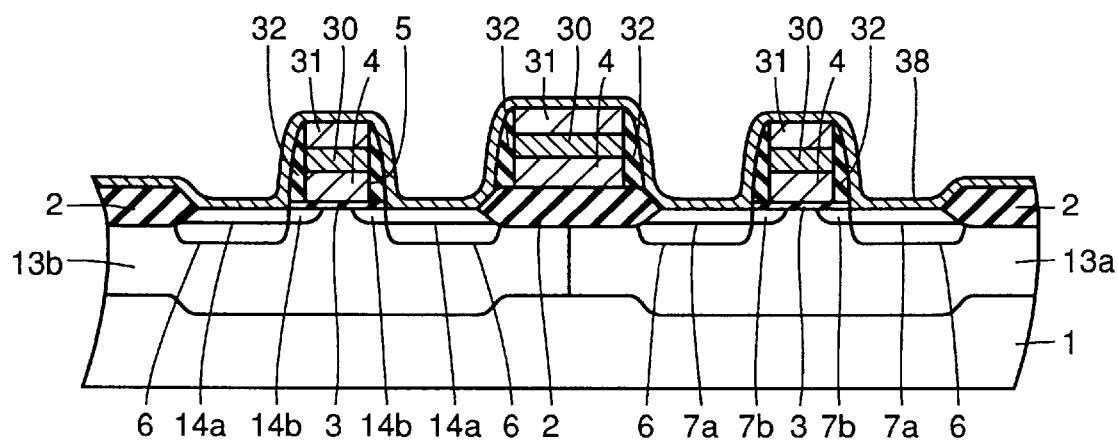

Then, a resist film 37 is formed as shown in FIG. 19, and p-type impurity ions are implanted into an upper portion of n-type diffusion region 13b in a direction 36 of ion implantation, that is, in a direction perpendicular to the main surface of semiconductor substrate 1. Thus, a p$^+$diffusion region 14a is formed. Then, resist film 37 is removed, n-type impurities are implanted into p-type diffusion region 13a as in the case of n-type diffusion region 13b, thereby forming an n$^+$diffusion region 7a. Thus, an LDD structure is formed. In addition, a natural oxide film which has been formed on each of source/drain regions 6 at the time of forming a diffusion layer is removed by light etching, whereby semiconductor substrate 1 thereon is exposed (FIG. 20).

Then, a titanium layer 38 of high refractory metal is formed on semiconductor substrate 1 by sputtering or the like (FIG. 21), and titanium layer 38 is silicified by the RTA method or the like. At this time, titanium layer 38 formed on titanium nitride layer 31 located above gate electrode 5 is not silicified, since titanium nitride layer 31 serves as a protection film therefor. On the other hand, only titanium layer 38 on each source/drain region 6 is silicified to be titanium silicide. Then, a portion of titanium layer 38 which has not become titanium silicide is removed, whereby the structure shown in FIG. 12 is completed.

Upon formation of a contact hole at the time of forming an interconnection on a field effect transistor formed on semiconductor substrate 1 as described above, an insulating film is deposited on the whole surface of semiconductor substrate 1 as in the case of the first embodiment. Then, a surface of the insulating film is planarized by the CMP method, and contact holes are formed simultaneously on the silicide layer on gate electrode 5 as well as silicide layers 16a and 16b on source/drain regions 6. Even if the depths of those contacts are different from each other, the silicide layer on gate electrode 5 as well as silicide layers 16a and 16b on source/drain regions 6 serve as a protection film for respective lower layers thereof, thereby preventing them from being etched through.

Since silicide layer 30 on gate electrode 5 is located at a higher position with respect to the main surface of semiconductor substrate 1 than each of silicide layers 16a and 16b on source/drain regions 6 as shown in FIG. 12, silicide layer 30 on gate electrode 5 might be etched excessively at the time of forming a contact hole. However, silicide layer 30 on gate electrode 5 is made of cobalt silicide having etching selectivity twice to three times that of titanium silicide layers 16a and 16b on source/drain regions 6. More specifically, in an etching condition at the time of forming contacts 17, 18a and 18b in insulating layer 20, etching rate of cobalt silicide layer 30 is lower than that of titanium silicide layers 16a and 16b. Thus, cobalt silicide layer 30 can be prevented from being etched excessively.

[Embodiment 3]

A third embodiment of the present invention will now be described.

Figure 22:
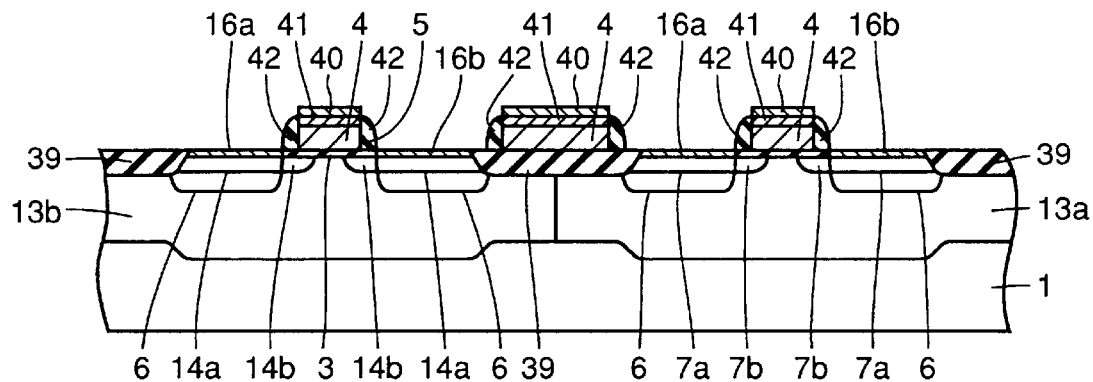
FIG. 22 is a cross section showing a semiconductor device in accordance with a third embodiment of the present invention.

In FIG. 22, an element isolation region 39 is formed by an LOCOS (LOCal Oxidation of Silicon) method, and has its upper portion etched away. A silicide layer 40 is made of the same material as that of silicide layers 16a and 16b formed on source/drain regions 6, and is formed by the same steps as those of silicide layers 16a and 16b. A silicide layer 41 is formed under silicide layer 40, and is made of material having larger etching selectivity than silicide layers 16a, 16b and 40.

The same reference as that shown in the conventional example, the first and the second embodiments indicates the same or a corresponding portion.

The manufacturing process of the semiconductor device shown in FIG. 22 will now be described with reference to FIGS. 23 to 34.

Figure 23:
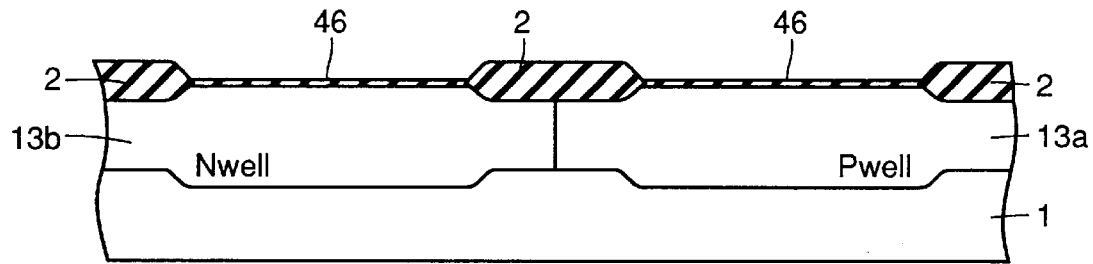
FIGS. 23 to 34 are cross sections respectively showing, in order, the steps of a method of manufacturing a semiconductor device in accordance with the third embodiment of the present invention.

First, in FIG. 23, a p-type impurity diffusion region 13a is formed at a main surface of a semiconductor substrate. An n-type impurity diffusion region 13b is formed at the main surface of semiconductor substrate 1. An element isolation region 2 is formed in a portion of an underlying oxide film 46 by the LOCOS method.

Figure 24:
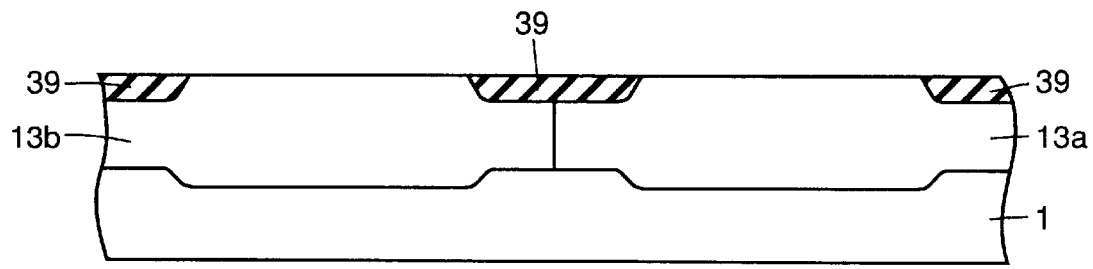
Figure 25:
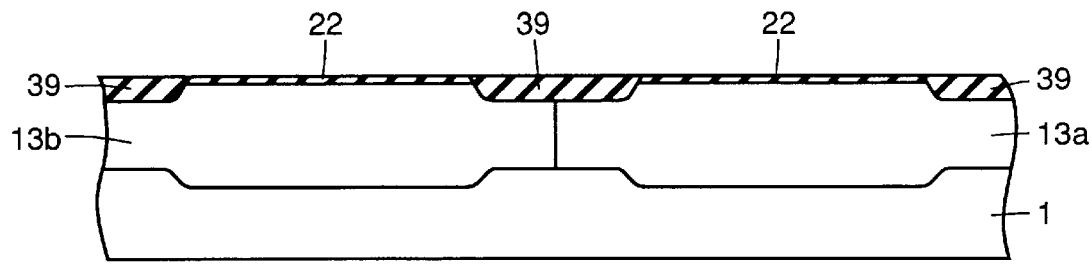
Figure 26:
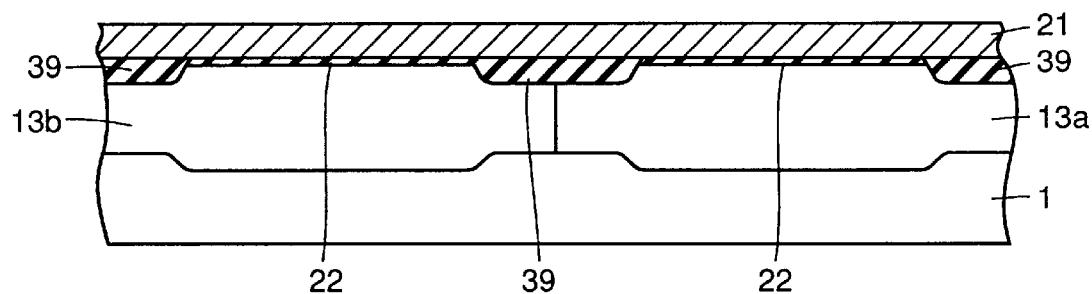
Figure 27:
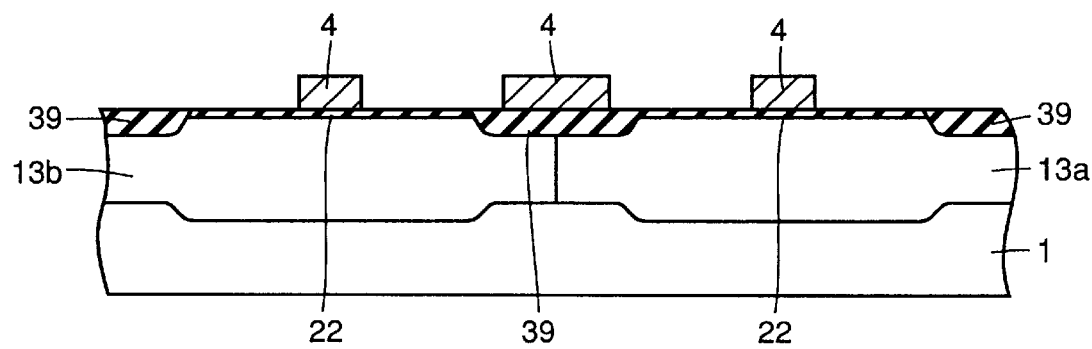

Then, an upper portion of the structure shown in FIG. 23 is etched to the main surface of semiconductor substrate 1 by the CMP method so as to planarize the surface thereof, thereby forming an element isolation region 39 (FIG. 24). Next, an insulating layer 22 which will be a gate insulating layer 3 is formed at the surface of semiconductor substrate 1 other than element isolation region 39 (FIG. 25). Then, a polycrystalline silicon layer 21 is formed as shown in FIG. 26, and is patterned by etching using a resist pattern formed thereon as a mask, thereby forming a silicon layer 4 which constitutes a gate electrode 5 (FIG. 27).

Figure 28:
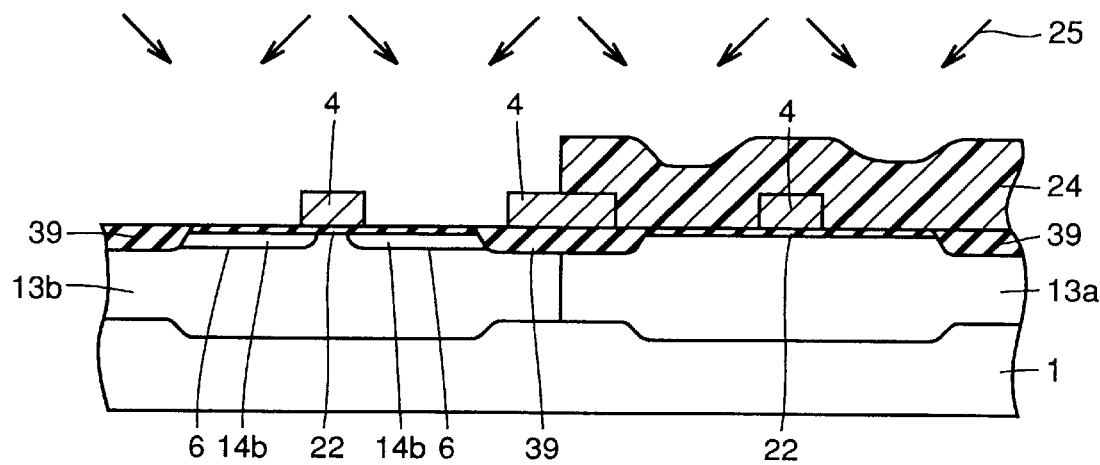
Figure 29:
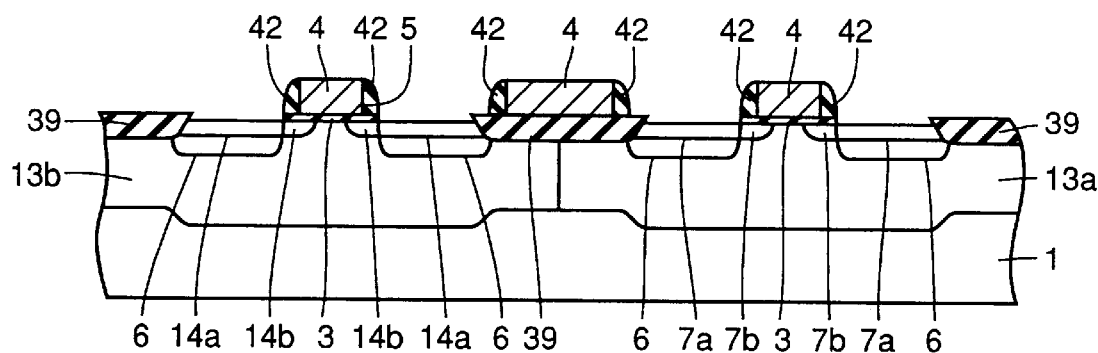

Then, an $n^-$impurity diffusion region 7b and a $p^-$impurity diffusion region 14b are formed as shown in FIG. 28 in a manner similar to the case of the first embodiment. After sidewalls 42 is formed on side surfaces of silicon layer 4 constituting gate electrode 5, an $n^+$impurity diffusion region 7a and a $p^+$impurity diffusion region 14a are formed at the main surface of semiconductor substrate 1 as in the case of the first embodiment (FIG. 29).

Figure 30:
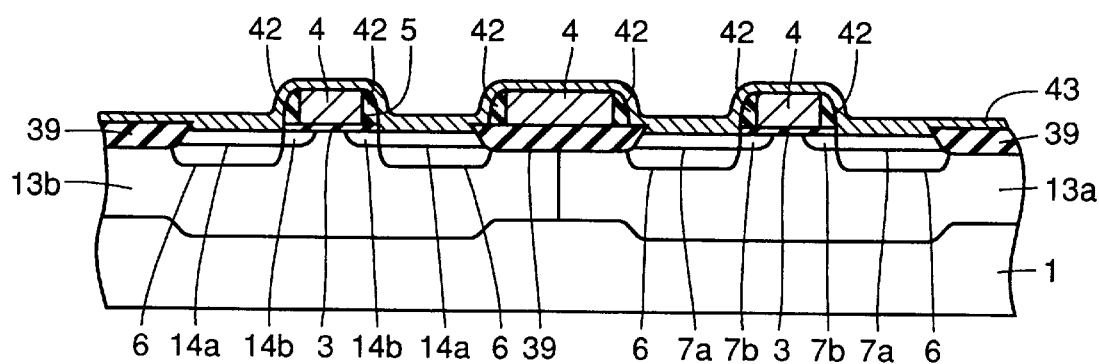
Figure 31:
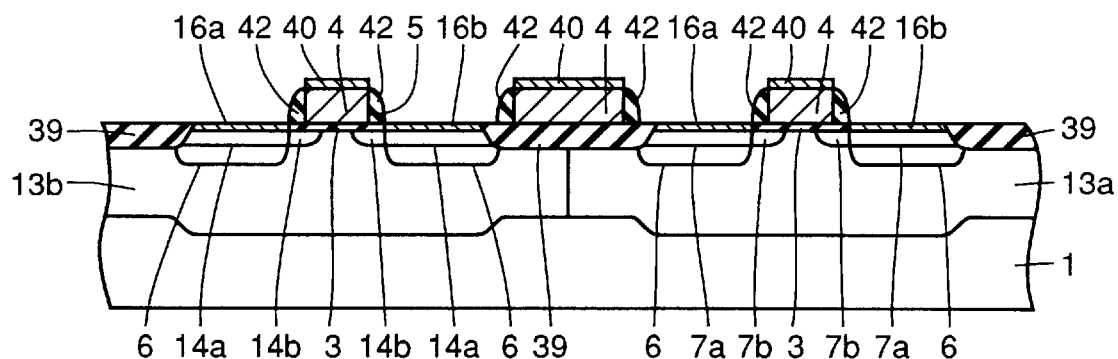

Then, insulating layer 22 formed on source/drain regions 6 is removed by light etching. After that, a titanium layer 43 is formed on the whole surface of semiconductor substrate 1 (FIG. 30). Titanium layer 43 is silicified by the RTA method, thereby forming titanium silicide layers 40, 16a and 16b on gate electrode 5 and source/drain regions 6, respectively (FIG. 31).

Figure 32:
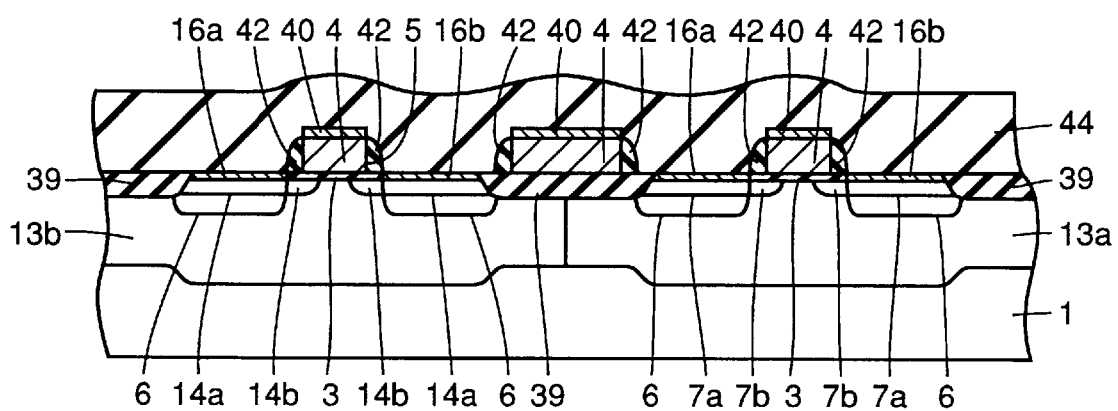
Figure 33:
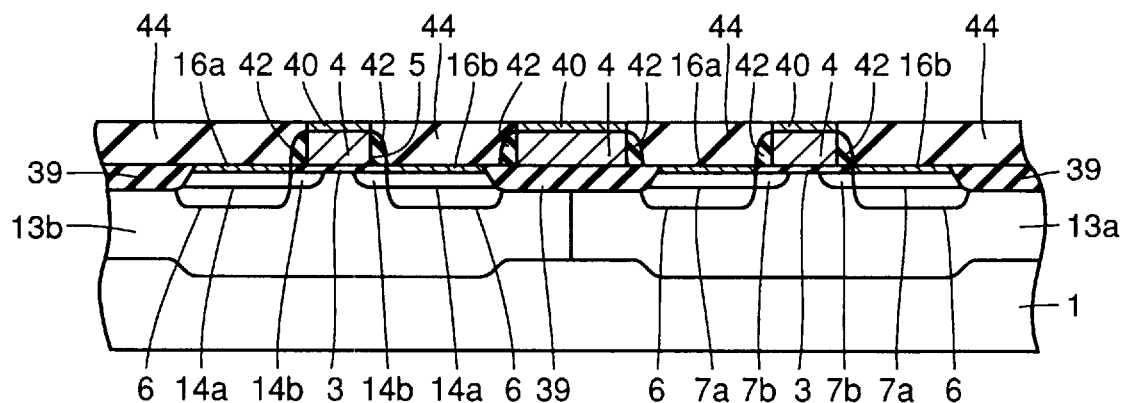
Figure 34:
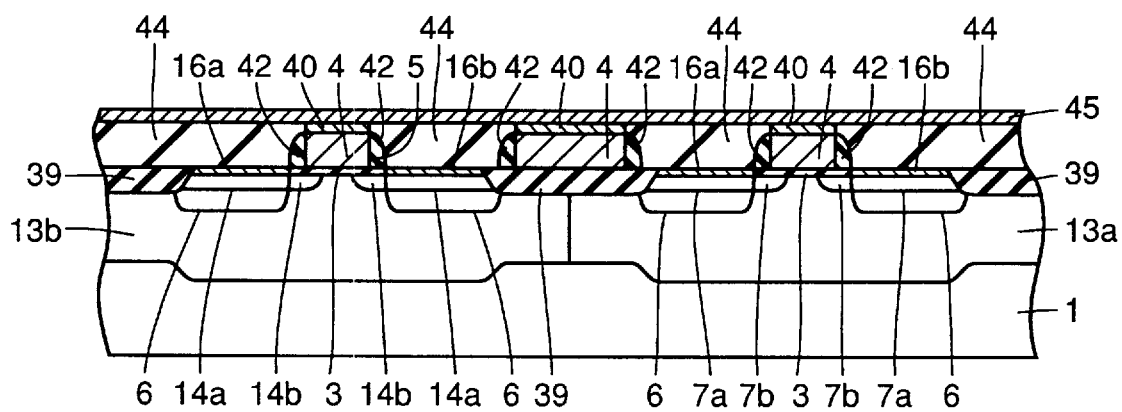

Then, an insulating layer 44 is deposited on the whole surface of semiconductor substrate 1 (FIG. 32). Insulating layer 44 is etched back to a top surface of silicide layer 40 formed on the gate electrode (FIG. 33). Then, a cobalt layer 45 is deposited on the whole surface of semiconductor substrate 1 (FIG. 34), and is thermally processed in an atmosphere of nitrogen, whereby a cobalt silicide layer 41 is formed under silicide layer 40 as shown in FIG. 22. Since this mechanism has been described already in Appl. Phys. Lett. 58 (12), 25 Mar., 1991 "Growth of Epitaxial $CoSi_2$ on (100)Si", VMIC Conference Jun. 12–13, 1990 "Formation of Self-Aligned TiN/$CoSi_2$ Bilayer from Co/Ti/Si and Its Applications in Salicide, Diffusion Barrier and Contact Fill" and the like, description thereof will not be repeated.

In the semiconductor device of FIG. 22 formed by this method, silicide layers 40 and 41 formed on gate electrode 5 are thicker than each of silicide layers 16a and 16b formed on source/drain regions 6. Furthermore, cobalt silicide layer 41 is made of material having etching selectivity twice to three times that of titanium silicide layers 16a, 16b and 40. Thus, even if contact holes are formed simultaneously on source/drain regions 6 and silicon layer 4 constituting gate electrode 5 after planarization of the insulating layer formed on the semiconductor device of FIG. 22 by the CMP method, silicide layers 16a, 16b, 40 and 41 serve as an etching stopper for source/drain regions 6 and gate electrode 5, respectively. Thus, gate electrode 5 can be prevented from being etched through.

In addition, use of the insulating layer planarized by the CMP method as described above allows formation of an interconnection and an element having high accuracy in size.

Although an upper portion of element isolation region 2 is etched away and gate electrode 5 on element isolation region 2 and gate electrode 5 on the main surface of semiconductor substrate 1 are formed to have the same height from the main surface of semiconductor substrate 1 in the third embodiment, similar effects can be obtained even if an upper portion of element isolation region 2 is left as shown in the first and the second embodiments.

Furthermore, this structure in which a top surface of the element isolation region is formed to be flush with the main surface of semiconductor substrate 1 can be used in the semiconductor devices shown in the first and the second embodiments.

In a semiconductor device in accordance with one aspect of the present invention, a silicide layer formed on a gate electrode layer is thicker than a silicide layer formed on a source/drain region. Thus, even if a planarized insulating layer is etched to form a contact hole therein, the gate electrode layer can be prevented from being damaged because of the presence of the relatively thick silicide layer formed thereon.

In a semiconductor device in accordance with one preferred aspect of the present invention, a silicide layer formed on a gate electrode layer has a structure in which a plurality of layers which are made of different material from each other are stacked. Thus, the gate electrode layer can be further restrained from being etched through at the time of etching for formation of a contact hole.

In a semiconductor device in accordance with another aspect of the present invention, a titanium nitride layer is further formed on a first silicide layer. Thus, in patterning the gate electrode layer, reflection of energy lines and the like at a bottom surface of a resist film can be restrained when a resist pattern formed on the titanium nitride layer is exposed.

In a semiconductor device in accordance with another preferred aspect of the present invention, a silicide layer having lower etching rate is formed on a gate electrode layer. Thus, the gate electrode layer is less susceptible to etching than a silicide layer formed on a source/drain region. Accordingly, the gate electrode layer can be prevented from being damaged by etching when a contact hole reaching to a surface of the source/drain region and a contact hole reaching to a surface of the gate electrode layer are formed simultaneously.

In a semiconductor device in accordance with a further aspect of the present invention, a silicide layer formed on a gate electrode layer has a structure in which a plurality of layers which are made of different material from each other are stacked. Thus, the gate electrode layer can be further restrained from being etched through at the time of etching for formation of a contact hole.

In a semiconductor device in accordance with a further preferred aspect of the present invention, a top surface of an element isolation insulating layer is substantially flush with a main surface of a semiconductor substrate. Thus, difference in height from the main surface of the semiconductor substrate between a gate electrode layer formed on the element isolation insulating layer and a silicide layer formed on a source/drain region at the main surface of the semiconductor substrate can be reduced.

In a method of manufacturing a semiconductor device in accordance with one aspect of the present invention, a silicide layer formed on a gate electrode layer is made thicker than a silicide layer formed on a source/drain region. Thus, even if a planarized insulating layer is etched to form a contact hole therein, the gate electrode layer can be prevented from being damaged because of the presence of the silicide layer thereon.

In a method of manufacturing a semiconductor device in accordance with another aspect of the present invention, a titanium nitride layer is further formed on a first silicide layer. Thus, reflection of energy lines and the like at a bottom surface of a resist film can be restrained when a resist pattern formed on the titanium nitride layer is exposed at the time of patterning the gate electrode layer.

In a method of manufacturing a semiconductor device in accordance with a further aspect of the present invention, a silicide layer on a gate electrode layer is formed to have a structure in which a plurality of layers which are made of different material from each other are stacked. Thus, the gate electrode layer can be restrained from being etched through at the time of etching for formation of a contact hole.

In a method of manufacturing a semiconductor device in accordance with a preferred aspect of the present invention, an element isolation insulating layer is etched such that a top surface thereof is substantially flush with a main surface of a semiconductor substrate. Thus, difference in height from the main surface of the semiconductor substrate between a gate electrode formed on the element isolation insulating layer and a silicide layer formed on a source/drain region at the main surface of the semiconductor substrate can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a main surface;
   a pair of source/drain regions formed with a prescribed space therebetween defining a channel region at the main surface of said semiconductor substrate;
   a gate electrode layer formed on said channel region with a gate insulating layer between said gate electrode layer and the main surface of said semiconductor substrate;
   a first silicide layer formed to be in contact with a surface of said source/drain region and having a first thickness;
   a second silicide layer formed of a single silicide layer to be in contact with a surface of said gate electrode layer and having a second thickness larger than said first thickness; and
   an insulating layer formed on said gate electrode layer and said source/drain regions, having contact holes reaching to respective surfaces of said first and second silicide layers, and having a substantially flat planarized top surface, wherein
   the second thickness of the second silicide layer is large enough to prevent penetration therethrough to the underlying gate electrode layer during etching to form said contact holes.

2. The semiconductor device according to claim 1, wherein each of said first and second silicide layers comprises a refractory metal silicide layer.

3. The semiconductor device according to claim 2, wherein said refractory metal silicide is titanium silicide.

4. A semiconductor device, comprising:
   a semiconductor substrate having a main surface;
   a pair of source/drain regions formed with a prescribed space therebetween defining a channel region at the main surface of said semiconductor substrate;
   a gate electrode layer formed on said channel region with a gate insulating layer between said gate electrode layer and the main surface of said semiconductor substrate;
   a first silicide layer formed to be in contact with a surface of said source/drain region and having a first thickness;
   a second silicide layer formed to be in contact with a surface of said gate electrode layer and having a second thickness larger than said first thickness; and
   an insulating layer formed on said gate electrode layer and said source/drain regions, having contact holes reaching to respective surfaces of said first and second silicide layers, and having a substantially flat planarized top surface, wherein
   the second thickness of the second silicide layer is large enough to prevent penetration therethrough to the underlying gate electrode layer during etching to form said contact holes, and said second layer is made of the same material as that of said first silicide layer.

5. The semiconductor device according to claim 4, wherein each of said second layer and said first silicide layer comprises a titanium silicide layer, and
   said first layer comprises a cobalt silicide layer.

6. The semiconductor device according to claim 1, further comprising:
   an element isolation insulating layer formed at the main surface of said semiconductor substrate, and having a top surface being substantially flush with the main surface of said semiconductor substrate; and
   a second gate electrode layer formed on said element isolation insulating layer, wherein
   a top surface of said gate electrode layer is located at a substantially same height as that of a top surface of said second gate electrode layer.

7. A semiconductor device, comprising:
   a semiconductor substrate having a main surface;
   a pair of source/drain regions formed with a prescribed space therebetween defining a channel region at the main surface of said semiconductor substrate;
   a gate electrode layer formed on said channel region with a gate insulating layer between said gate electrode layer and said main surface of the semiconductor substrate;
   a first silicide layer formed to be in contact with each surface of said source/drain regions;
   a second silicide layer formed to be in contact with a surface of said gate electrode layer, and is made of material different from that of said first silicide layer;
   a titanium nitride layer formed on said second silicide layer; and
   a sidewall insulating layer formed to be in contact with respective sidewalls of said gate electrode layer, said second silicide layer and said titanium nitride layer.

8. The semiconductor device according to claim 7, wherein said second silicide layer is made of material of which etching rate is lower than that of said first silicide layer.

9. The semiconductor device according to claim 7, wherein said first silicide layer has a titanium silicide layer, and said second silicide layer has a cobalt silicide layer.

10. A semiconductor device, comprising:
    a semiconductor substrate having a main surface;
    a pair of source/drain regions formed with a prescribed space therebetween defining a channel region at the main surface of said semiconductor substrate;
    a gate electrode layer formed on said channel region with a gate insulating layer between said gate electrode layer and said main surface of said semiconductor substrate, said gate electrode layer having an upper surface and side surfaces;
    a first silicide layer formed to be in contact with each surface of said source/drain regions; and a second silicide layer formed to be in contact with said upper surface of said gate electrode layer and having side surfaces, wherein said second silicide layer includes a first layer formed on said gate electrode layer, a second layer formed on said first layer and is made of material different from that of said first layer, and an insulating sidewall spacer formed in contact with the side surfaces of the gate electrode and second silicide layer.

11. The semiconductor device according to claim 10, wherein said first layer is made of material of which etching rate is lower than that of said second layer.

12. The semiconductor device according to claim 10, wherein said first layer has a cobalt silicide layer, and said second layer has a titanium silicide layer.

13. The semiconductor device according to claim 10, further comprising:

an element isolation insulating layer formed at the main surface of said semiconductor substrate such that a top surface thereof is substantially flush with the main surface of said semiconductor substrate; and a second gate electrode layer formed on said element isolation insulating layer, wherein a top surface of said gate electrode layer is located at a substantially same height as that of a top surface of said second gate electrode layer.

14. A semiconductor device, comprising:

a semiconductor substrate having a main surface;

a pair of source/drain regions formed with a prescribed space therebetween defining a channel region at the main surface of said semiconductor substrate;

a gate electrode layer formed on said channel region with a gate insulating layer between said gate electrode and said main surface of the semiconductor substrate;

a first silicide layer formed to be in contact with a surface of said source/drain region and having a first thickness;

a second silicide layer formed to be in contact with a surface of said gate electrode layer and having a second thickness larger than said first thickness; and an insulating layer formed on said gate electrode layer and said source/drain regions, having contact holes reaching to respective surfaces of said first and second silicide layers, and having a substantially flat top surface, wherein said second silicide layer includes a first layer formed on said gate electrode layer; and a second layer formed on said first layer and is made of material different from that of said first layer, and said second layer is made of material same as that of said first silicide layer.

15. The semiconductor device according to claim 14, wherein each of said second layer and said first silicide layer comprises a titanium silicide layer, and said first layer comprises a cobalt silicide layer.

16. A semiconductor device, comprising:

a semiconductor substrate having a main surface;

a pair of source/drain regions formed with a prescribed space therebetween defining a channel region at the main surface of said semiconductor substrate;

a gate electrode layer formed on said channel region with a gate insulating layer between said rate electrode layer and said main surface of the semiconductor substrate;

a first silicide layer formed to be in contact with each surface of said source/drain regions; and a second silicide layer formed to be in contact with a surface of said gate electrode layer, wherein said second silicide layer includes a first layer formed on said gate electrode layer, and a second layer formed on said first layer and is made of material different from that of said first layer, wherein said first layer comprises a cobalt silicide layer, and said second layer comprises a titanium silicide layer.

* * * * *